United States Patent [19]

Dorsey et al.

[11] 3,735,268

[45] May 22, 1973

[54] DUPLEX TUNING FOR RADIO RECEIVERS

[75] Inventors: Charles M. Dorsey; Harold J. Laurent; Michael Slavin, all of Baltimore; Reuben Laverne Stauffer, Timonium, all of Md.

[73] Assignee: The Bendix Corporation, Southfield, Mich.

[22] Filed: Sept. 15, 1970

[21] Appl. No.: 72,470

[52] U.S. Cl. ..................325/464, 325/420, 325/455, 334/15

[51] Int. Cl. ..............................................H04b 1/34

[58] Field of Search......................325/418, 422, 452, 325/459, 462, 464, 465, 468, 469, 470; 334/11, 14, 15

[56] References Cited

UNITED STATES PATENTS

| | | | |
|---|---|---|---|
| 3,528,044 | 9/1970 | Manicki | 325/465 X |
| 3,631,349 | 12/1971 | Rhee | 325/470 |
| 3,544,903 | 12/1970 | Sakamoto | 325/459 |
| 3,102,987 | 9/1963 | Yasuda | 334/14 X |
| 2,687,514 | 8/1954 | Roberts | 325/468 X |

*Primary Examiner*—Benedict V. Safourek
*Attorney*—Plante, Hartz, Smith & Thompson, Bruce L. Lamb and William G. Christoforo

[57] ABSTRACT

A tuning system for a radio receiver is disclosed in which manual tuning is performed by means of mechanically slug-tuned coils and automatic, signal-seeking tuning is performed by all-electronic means including a varactor. The coil and varactor form a resonant circuit which can be tuned over the entire frequency range of interest by variation of one tuning element, the other being held at a constant reactance value. For manual tuning, the varactor is held at a constant reactance value while the coil is tuned. For automatic tuning, the varactor is tuned and the coil is held fixed. A zone type electronic display is disclosed for use with the automatic tuning function.

9 Claims, 4 Drawing Figures

Patented May 22, 1973 3,735,268

INVENTORS
CHARLES M. DORSEY
HAROLD J. LAURENT
MICHAEL SLAVIN
REUBEN LAVERNE STAUFFER
BY Plante, Hartz, Smith & Thompson
ATTORNEYS

DUPLEX TUNING FOR RADIO RECEIVERS

This invention relates to tuners for radio receivers. More particularly, the invention relates to automobile radio receivers employing automatic signal-seeking turners and manual tuners which may be used alternatively at the option of the user.

Background of the Invention

Manual tuning automobile radios currently employ permeability tuning in which a ferromagnetic core slug is mechanically moved into and out of a tuning coil. Tuned frequency indication is provided in these radios by mechanical means connected to the drive means of said slugs which causes a pointer to move across a "dial card" calibrated in frequency.

Presently available automatic-tuning signal-seeking automobile radios employ the manual tuning means described above, together with additional mechanical drive means which operate said tuning means when the user selects the "seek mode" of operation. Since the ability to stop tuning precisely on signal and substantially constant tuning rate across the band are desired, such mechanical drive means are very complicated and costly. U.S. Pat. No. 2,843,734 issued to C. S. Lerch, Jr. et al. is exemplary of such mechanical drive means.

Electronic tuners are known in the radio receiver art. Such tuners employ an element whose electrical reactance can be made to vary by the application thereto of a control signal. The most common such element is the varactor diode whose junction capacitance is varied by varying the bias potential applied thereto. Electronic tuners utilizing varactor diodes as the variable capacitor element in a tuning tank circuit for frequency selection have not been widely employed in entertainment receivers. Their use, however, is fairly common in the surveillance receiver art. Electronic tuners of this type are employed in both manually and automatically tuned receivers. In manual tuning, the varactor control signal is typically derived from a potentiometer connected across a constant voltage source. In automatic tuning, the varactor control signal is provided by a voltage function generator.

One of the most useful voltage functions for varactor automatic tuning is the ramp function. Since a ramp function can be generated by a simple RC circuit including only one active element, varactor automatic tuning can be achieved with simple circuitry at a cost which is about one-fifth that of mechanical automatic tuning. On the other hand, since varactor automatic tuning involves no moving parts, the simple and inexpensive tuned frequency indicators which are employed in mechanical tuners cannot be used with a varactor automatic tuner. The typical varactor tuner frequency indicator is more expensive than the tuner itself. Such indicators range in complexity from high impedance voltmeter circuits which provide analog indications of the selected frequency to digital frequency counting and display circuits which respond to the local oscillator frequency to provide indications of the selected frequency.

In an automobile radio, manual tuning is desired in order to enable the user to select a particular station to which he wishes to listen. For this purpose a tuning dial is needed. It is also desirable for the motorist to be able to quickly select a station from a limited number of favorite stations in his local area. For this purpose, the mechanical push-button tuner, well known in the art, is employed. In push-button tuners, a cam connected to each push button engages a treadle bar to rotate the same an amount determined by the presetting of said cam. The treadle bar may position a rotary capacitor, or through further mechanism, may control the position of slugs within tuning coils. Because the same mechanical tuning components are used for push-button station selection as for continuous manual tuning, the same tuning dial displays the selected frequency when either method of tuning is employed. The motorist, however, typically does not even look at the tuning dial when using his push-button station selection means. His intent is to be tuned to the desired station, not to determine the frequency at which the station is broadcasting.

Similarly, when a motorist uses the signal seeking feature of his automobile radio, he intends to be tuned in to the next station in the broadcast band which can be adequately received. He is not concerned with knowing the frequency of that station. If a tuning indicator were provided, the motorist probably would not look at it.

The value of both push-button and signal-seeking tuning in automobile radios is that they allow the motorist to change stations while maintaining a hands-on-wheel, eyes-on-road driving condition.

Although the tuning dial is seldom observed when operating in the signal-seeking mode, a user may come upon a station which particularly appeals to him. He would therefore wish to be able to intentionally select that station again in the future. For this purpose, an indication of the location of the station within the band would be of value. Ideally, an indicator for this purpose would operate inobtrusively so that it would not distract the driver's attention, and yet, at the same time, would be readable and interpretable at a glance when desired, so that its use would not require the concentrated attention of the driver at any time.

Accordingly, it is an object of this invention to provide an automobile radio tuner which utilizes mechanical manual tuning and electronic automatic signal-seeking tuning.

It is another object to provide such a tuner wherein the mechanical tuning means includes favorite station push-button tuning and mechanical tuned frequency indication means, and wherein the electronic automatic signal-seeking tuning means has alternatively either unobtrusive zone-type tuned frequency indication means, or no provision for tuned frequency indication.

Another object of this invention is to provide such a tuner which is highly compact in size and inexpensive to manufacture.

Another object is to provide such a tuner wherein the automatic signal seeking function is performed at high speed.

These and other objects, features and advantages of this invention will appear from the following description and appended claims when read in view of the accompanying drawing.

Briefly, the invention is embodied in a radio receiver in which the tuned circuits included in the RF amplifier stage, the mixer, and the local oscillator include two tunable reactance elements connected electrically in parallel. One of the tunable reactance elements is a mechanically tunable element which is preferably a slug tuned coil. The other tunable reactance element is an electronically tunable element which is preferably a varactor diode. The reactance of each of the tunable elements is variable over a sufficient range so that each element is independently capable of tuning the receiver over the entirety of the desired reception band. The mechanically variable reactance is used for manual tuning and the electronically variable reactance is used for automatic signal seeking tuning. In the preferred embodiment, manual tuning is accomplished by positioning slugs in the tuning coils with the varactor diode clamped to its high voltage, low capacitance, high frequency extreme. Automatic signal seek tuning is accomplished by withdrawing the tuning slugs to their extreme high frequency position and driving the varactor with a decreasing voltage function. A control circuit is provided in the receiver for causing the tuning voltage function generator sweep to stop when a signal of acceptable strength is received. In addition to being applied to the varactors of the inventive tuner, the output of the tuning voltage function generator is made available to drive a novel zone-type tuned frequency indicator. In the preferred embodiment the indicator includes multitap resistive voltage divider means for generating a plurality of fixed reference voltages which are compared with the output voltage of the tuning voltage function generator by a digital comparator circuit. The comparator circuit has a plurality of output terminals which are selectively energized as the tuning voltage varies in relation to the reference voltages. A low level light emitting device is connected to each of the output terminals of the digital comparator. The lights are arranged linearly on the front panel of the receiver in proximity to the frequency scale so that as the tuning voltage varies, the lights indicate the portion of the band to which the receiver is tuned. When the manual tuning mode is employed, tuned frequency indication is provided in the usual manner by means of a mechanical pointer which is moved across the frequency scale by means of a mechanical linkage driven by the mechanical tuning control.

Figure 1:
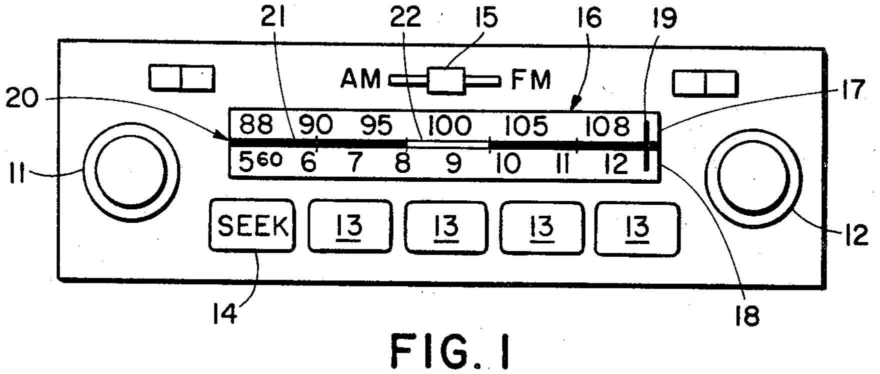
FIG. 1 is a front panel elevation view of a radio receiving set embodying the instant invention.

FIG. 1 is a front panel elevation view of a radio receiver unit embodying the instant invention. The volume control with power switch ganged thereto is adjusted by knob 11 and manual tuning effected by knob 12 in the manner known in the art. A plurality of tuning push buttons 13 are also provided on the front panel for mechanical tuning of the receiver to a preselected favorite station and may be used in place of knob 12 at the option of the user. Push buttons 13 are connected to tuning slides, not shown, each of which carries a resettable tuning cam urged by its associated push button and slide against a treadle bar whereby the linear motion of the tuning slide is translated into rotational motion of the treadle bar to effect mechanical tuning in the manner known in the art. Another push button 14 is also provided on the front panel. Like push buttons 13, push button 14 is associated with a tuning slide and a tuning cam mounted thereon acting against said treadle bar. Unlike push buttons 13, the tuning cam associated with push button 14 is fixedly mounted on its associated tuning slide and is not resettable. The cam associated with push button 14 is so disposed that it acts upon the treadle bar to cause the mechanical tuning slugs to be withdrawn from the tuning coils to their maximum high frequency position. Additionally, an electrical switch is disposed within the radio set so as to be actuated by push button 14 or its associated tuning slide during the last portion of travel of said pushbutton upon depression. Said electrical switch initiates the generation of the tuning voltage signal by the tuning voltage function generator. Therefore, depression of push button 14 may be seen to first cause the mechanical tuning means to be tuned to the high frequency extreme and then to initiate the electronic tuning process. The front panel also contains a switch 15 for setting the receiver into either AM or FM mode, and a tuning dial 16 containing FM tuning card 17 and AM tuning card 18. A dial pointer 19 is connected to the tuning mechanism in the usual manner and traverses dial 16 as knob 12 or push buttons 13 are actuated so as to indicate the selected frequency on cards 17 or 18. FIG. 1 illustrates the condition which would be observed a short time after depression of push button 14, indicator 19 is at the extreme high frequency end of the scale and electronic tuning is being performed. The zone-type tuned frequency indicator for use with the electronic tuning mode 20 is disposed between dial cards 17 and 18. Indicator 20 comprises a plurality of light sources 21, one of which, 22, is shown illuminated, indicating that the receiver is tuned to a frequency between 98 and 104 MHz.

Figure 2:
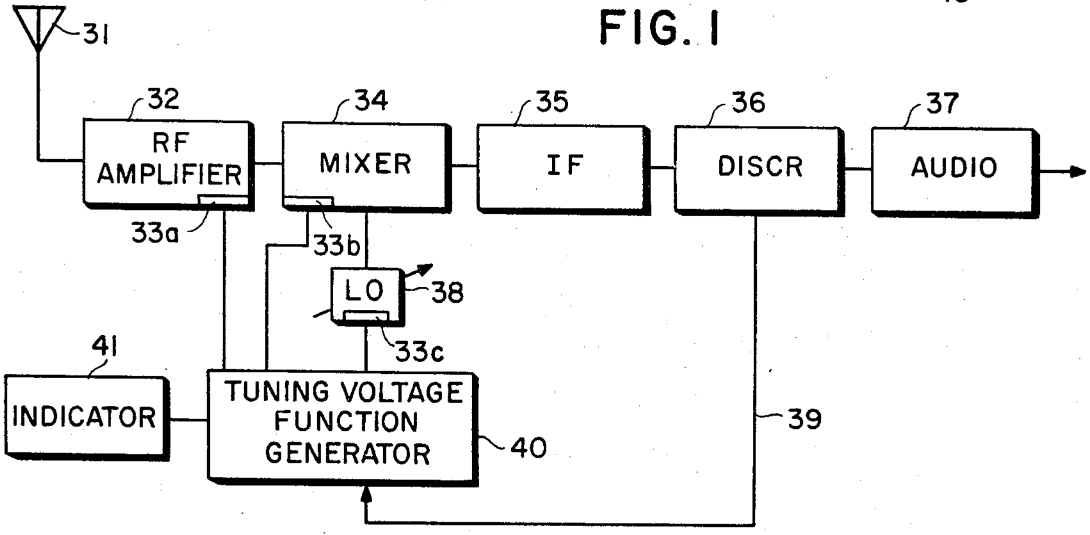
FIG. 2 is a block diagram of radio receiving set embodying the instant invention.

FIG. 2 illustrates in block form a radio receiver embodying the instant invention. The signal received by antenna 31 is amplified in RF amplifier 32. RF amplifier 32 is tuned by a tuned circuit **33*a* included therein which is constructed according to the instant invention. The output of RF amplifier 32 is fed to mixer 34 which likewise includes a tuned circuit 33*b* in accordance with the instant invention. Mixer 34 also receives the output signal of a local oscillator 38, which is tuned by a third tuned circuit 33*c* according to the instant invention. Tuned circuits 33 are tuned either by mechanical means, as will be further discussed hereinafter, or by electronic means driven by tuning voltage function generator 40. The heterodyne output of mixer 34 is applied to IF amplifier 35. IF amplifier 35 drives discriminator 36. Discriminator 36 has two outputs. The first output provides demodulated signal to audio amplifier 37 in the FM mode. In the AM mode, an AM detector, not shown, is interposed before audio amplifier 37. The second output of discriminator 36 is applied by means of conductor 39 to tuning voltage function generator 40** for the purpose of stopping the tuning voltage function when a signal of adequate strength is being received. The tuning voltage function generator may be a relaxation oscillator ramp function generator, in which case the stop signal would be applied to the active element to vary the conductance thereof; said active element being connected to draw current from the charging circuit of said relaxation oscillator, whereby the output voltage of said relaxation oscillator is held at a constant value as long as said stop signal is present, as is known in the art. However, the tuning voltage function generator and stop means are preferably those disclosed in U.S. patent application Ser. No. 71,708 filed Sept. 14, 1970, by George D. Wofford, for Varactor Tuning Circuit, which is assigned to the assignee of the instant application. In addition to driving tuned circuits 33, tuning voltage function generator 40 also drives zone-type tuned frequency display 41.

Figures 3, 4:
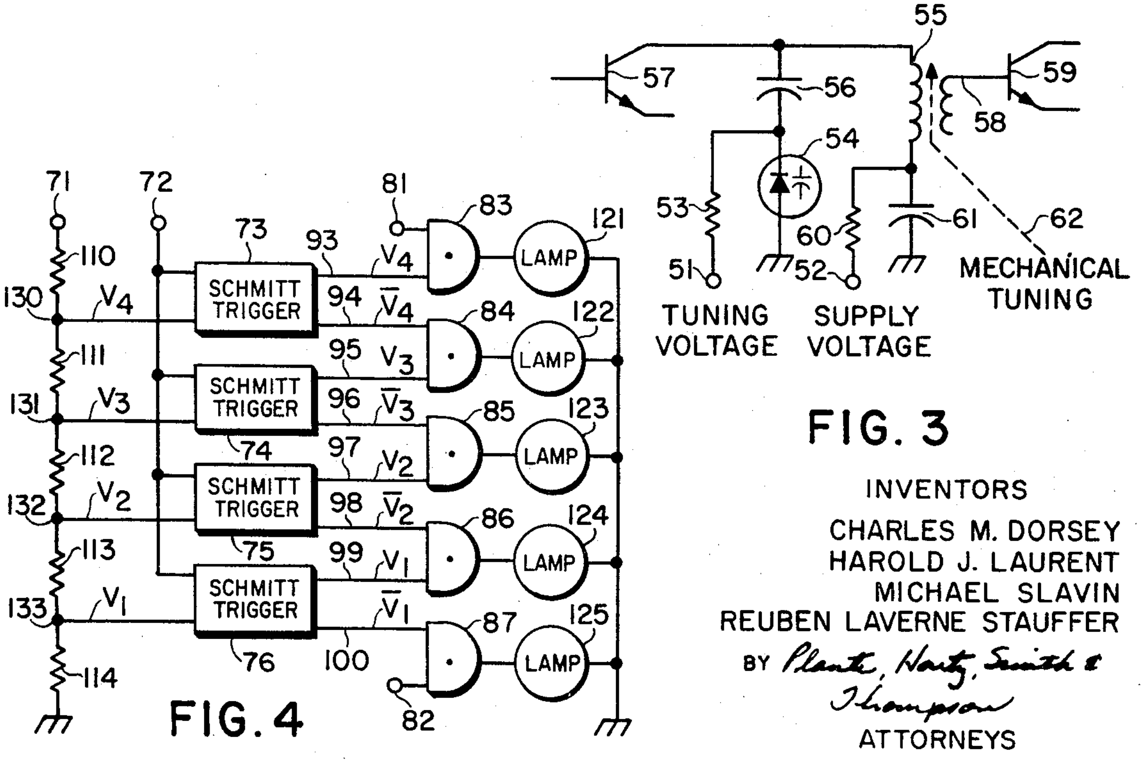
FIG. 3 is an electrical schematic diagram of the inventive tuned circuit.
FIG. 4 is a logic block diagram of the zone-type tuned frequency indicator.

An electrical schematic diagram of the novel tuned circuit 33 of FIG. 2 is shown in FIG. 3. Terminal 51 is connected to the tuning voltage function generator and terminal 52 provides for connection to a source of operating power. The inventive circuit is shown as a tuning tank for transistor 57 which may be in the RF or mixer stage of the receiver. The tuning elements are varactor 54 and slug tuned coil 55 which are connected electrically in parallel in the collector circuit of transistor 57. The tuning voltage connected to terminal 51 is applied through resistor 53 across the junction of varactor diode 54, whereby the capacitance of the varactor is varied. Slug tuned coil 55 is tuned by moving the slug through mechanical linkage 62 in the manner known in the art. The output of the tuned circuit is link coupled by coil 58 to transistor 59. Operating voltage is connected from terminal 52, in the usual manner, through an appropriate resistor 60 and coil 55, bypassed by capacitor 61, to the collector of transistor 57. Capacitor 56 is a d.c. blocking capacitor preventing interconnection between the supply voltage and the tuning voltage. Linkage 62 is connected to tuning knob 12 and push buttons 13 of FIG. 1 in the manner known in the art. As discussed above, linkage 62 is also connected in the usual manner to push button 14 which carries a fixed cam disposed to withdraw the slug from coil 55 to its extreme position. Push button 14 also actuates an electrical switch which causes the tuning voltage function to be applied at terminal 51 of FIG. 3.

FIG. 4 is a logic block diagram of the zone-type display tuned frequency indicator. Terminal 71 is connected to a constant voltage source and through resistors 110 through 114 to ground. Resistors 110 through 114 constitute a multi-tap resistive voltage divider network which provides a plurality of reference voltages at taps 130 through 133. Terminal 72 is connected to the output of the tuning voltage function generator 40. A plurality of Schmitt triggers 73 through 76 are connected in parallel to terminal 72. Each of Schmitt triggers 73 through 76 is connected individually to taps 130 to 133, tap 130 being connected to Schmitt trigger 73, tap 131 to Schmitt trigger 74, etc. Schmitt triggers 73 through 76 function in the usual manner, providing either of two outputs depending upon whether the tuning voltage applied to each Schmitt trigger through terminal 72 is greater or lesser in amplitude than the reference voltage applied to the particular Schmitt trigger. Schmitt trigger 73 has output lines 93 and 94, Schmitt trigger 74 has output lines 95 and 96, Schmitt trigger 75 has output lines 97 and 98, and Schmitt trigger 76 has output lines 99 and 100. Output line 93 of Schmitt trigger 73 is connected to one terminal of two terminal AND gate 83. Output line 94 of Schmitt trigger 73 is connected to one terminal of AND gate 84. The other terminal of AND gate 84 is connected to output line 95 of Schmitt trigger 74. Similarly, AND gate 85 is connected to lines 96 and 97 of Schmitt triggers 74 and 75, and so on. The output terminals of each of AND gates 83 through 87 are connected respectively to low level light emitting device 121 through 125. AND gates 83 and 87 each have one input terminal, 81 and 82 respectively, which are not connected to any Schmitt trigger. These terminals 81 and 82 are maintained at logic 1 level at all times. Light emitting devices 121 through 125 may be incandescent lamps, light emitting diodes, or other suitable low level light emitting devices. For convenience they will be hereinafter called lamps. Lamps 121 through 125 are also shown in FIG. 1 as the light sources 21 of indicator 20.

The operation of the zone-type tuned frequency indicator may now be described. The tuned frequency is proportional to the output amplitude of the tuning voltage function generator which is applied to terminal 72. If and only if said output amplitude exceeds the reference voltage at tap 130, a logic 1 appears at output line 93 of Schmitt trigger 73 and AND gate 83 is enabled, thereby lighting lamp 121. When said output amplitude decreases to a level between that of reference taps 130 and 131, line 93 goes to logic 0 and line 94 goes to logic 1. Lamp 121 is therefore extinguished. Line 95 of Schmitt trigger 74 is at logic 1 since the tuning voltage is above the reference voltage of tap 131. Therefore, lines 94 and 95 are at logic 1 and AND gate 84 is enabled. Therefore, lamp 122 is illuminated. Similarly, each of AND gates 85, 86 and 87 are enabled in order as the tuning voltage decreases, and lamps 123, 124 and 125 are sequentially illuminated.

The invention claimed is:

1. In a radio receiving set having mechanical tuning means tunable over a frequency range of interest for selecting the frequency to be received, said mechanical tuning means including a first variable reactance element having a high reactance extreme and a low reactance extreme, the improvement which comprises:

a second tuning means tunable over said frequency range of interest for selecting the frequency to be received, said second tuning means including a second variable reactance element having a high reactance extreme and a low reactance extreme, said second variable reactance element being connected to said first variable reactance element to form a resonant circuit, said second variable reactance element being variable by the application of a voltage thereto;

tuning voltage function generator means connected to said second tuning means for applying a time varying signal to said second variable reactance element for varying the reactance thereof while simultaneously holding the reactance of said first variable reactance element constant at one said extreme thereof; and, means for varying said first variable reactance element while holding the reactance of said second variable reactance element constant at one said extreme thereof, whereby said receiving set may be tuned across said frequency range of interest by variation of either of said variable reactance elements, the other of said variable reactance elements being held at a constant reactance value.

2. A radio receiving set as recited in claim 1 including additionally signal responsive means having input and output terminals, said input terminal being connected to sample a received signal being received by said receiver, said output terminal being connected to said tuning voltage function generator to provide a control signal to stop the time variation of said time varying signal when said received signal is above a preselected level.

3. The radio set of claim 2 wherein: said first variable reactance element is a slug tuned coil; and said second variable reactance element is a varactor diode.

4. The radio set of claim 3 wherein said tuning voltage function generator means includes means for simultaneously moving the tuning slug of said slug tuned coil to one said extreme position of its reactance range and initiating the generation of said time varying signal by said tuning voltage function generator.

5. A radio receiving set as recited in claim 2 including means for indicating the portion of the frequency band to which said receiving set has been tuned by said second tuning means, said indicating means comprising:

means for generating a plurality of reference voltages;

comparator means for comparing said time varying signal with said reference voltages and generating a signal indicative of the relationship between said time varying signal and said reference voltages; and light emitting indicator means for receiving said indicative signal and for displaying said relationship.

6. The radio set of claim 5 wherein:

said means for generating reference voltages includes a multitap resistive voltage divider network;

said comparator means includes a plurality of bistable trigger circuits and a plurality of AND gates, each of said bistable trigger circuits having two input terminals and two output terminals, one of said input terminals being connected to one tap of said multitap voltage divider network, the other of said input terminals being connected to said tuning voltage function generator to receive said time varying signal, said output terminals being connected to said AND gates, each of said AND gates having an output terminal; and said light emitting means includes a plurality of light emitting devices, each said light emitting device being connected to one said output terminal of one said AND gate.

7. The radio set of claim 6 wherein said light emitting devices are incandescent lamps.

8. The radio set of claim 6 wherein said light emitting devices are light emitting diodes.

9. The radio set of claim 6 wherein said bistable trigger circuits are Schmitt triggers.

* * * * *